Oct. 25, 1966 E. A. CORL ETAL 3,280,715

MICROPATTERN ALIGNING DEVICE

Filed June 11, 1964 2 Sheets-Sheet 1

INVENTORS
EDWIN A. CORL
ANDREW P. KOEHM
BY Shenier + O'Connor
ATTORNEYS

Oct. 25, 1966 E. A. CORL ET AL 3,280,715

MICROPATTERN ALIGNING DEVICE

Filed June 11, 1964

2 Sheets-Sheet 2

INVENTORS
EDWIN A. CORL
ANDREW P. KOEHM
BY Shenier & O'Connor
ATTORNEYS 3,280,715

MICROPATTERN ALIGNING DEVICE

Edwin A. Corl, Bethel, and Andrew P. Koehm, Trumbull, Conn., assignors to United Aircraft Corporation, East Hartford, Conn., a corporation of Delaware Filed June 11, 1964, Ser. No. 374,386
6 Claims. (Cl. 95—76)

Our invention relates to a micropattern aligning device and more particularly to a device for rapidly and accurately positioning photographic patterns on glass slides or on metal masks over previously produced patterns in the production of ultraminiature unitary electronic circuits.

In the manufacture of microcircuitry as, for example, by the successive treatment of passivated semiconductor wafers having epitaxial layers, integral circuits are formed by a series of operations each of which employs a mask or pattern of predetermined design. It is essential to the successful manufacture of integral microcircuitry that the successive patterns or masks be precisely and accurately aligned over a subcircuit theretofore produced before the ensuing operation is conducted.

There are devices available in the prior art which are expensive and unsatisfactory. In one type of device the wafer to be treated rests on a chuck which is aligned in parallelism with a mask. In this device, both the mask and the wafer are held in aligned position by reduced pressure or partial vacuum. It frequently happens that the wafer being processed which is carried by the chuck, is not precisely parallel to the mask surface. The base of the wafer carrying chuck is curved and mates with a similarly curved surface. The curved base of the wafer chuck of this machine of the prior art is intended to maintain the mating surfaces parallel to the mask. Frequently, however, it does not function as intended since the curved mating bearing surfaces are not frictionless or free from hysteresis. Because of this the wafer often will contact the mask at a slight angle and the differential pressure resulting from the partial vacuum is not sufficient to bring about the desired and vital parallelism between the mask and the wafer. We have found that anything but intimate contact between the mask and the substrate or photoresist material on the substrate will result in a loss of pattern quality and in poor resolution.

Furthermore, in devices in which a partial vacuum is relied upon to hold the pattern and the wafer in contact, an increase in pressure or loss of vacuum is frequently experienced. When this occurs relative motion between the parts takes place and the wafer is abraided against the lifted mask thereby damaging the desired pattern on the wafer or photoresist.

It frequently happens that vacuum deposition of metals or metallization is required in the processes performed to produce integral circuitry. The machines of the prior art are so large and cumbersome that they are ill adapted to be used in connection with vacuum evaporation of metal and its deposition through a mask, owing to their size and complexity and the need for maintaining a partial vacuum during the metallization step.

Still other types of alignment machines employ a gimbal assembly to support the mask, which gimbal assembly is adjustable for achieving absolute parallelism between the mask and the substrate through mechanical contact between the parts. In these units, the mask is held against the substrate by mechanical pressure. These mechanical securing assemblies do not permit either free surface alignment or sufficiently good contact between mask and substrate.

One object of our invention is to provide a micropattern aligning device in which the mask and substrate surfaces are always in parallelism irrespective of variations in the thickness of the substrates or wafers.

Another object of our invention is to provide a simple, conveniently used and accurate micropattern aligning device in which the deleterious effects of frictional hysteresis which hinder or prevent accurate mating of the wafer with the mask are avoided.

A further object of our invention is to provide a micropattern aligning device in which no gimbal, mechanical stop or rocking wafer base constructions are required.

Still another object of our invention is to provide a micropattern aligning device in which the mask is held against the substrate independent of partial vacuum or reduced pressure.

Yet a further object of our invention is to provide a micropattern aligning device which may be simply and advantageously used for vacuum metallization.

Yet another object of our invention is to provide a micropattern aligning device of simple construction in which no mechanical linkage is required to force the mask in any direction either laterally or rotationally and which can be easily and accurately manually manipulated.

Other and further objects of our invention will appear from the following description:

In general our invention contemplates a vacuum chuck for holding the wafer to be treated over which is carried the mask or photographic pattern to be reproduced upon the wafer. The mask carrying means and the wafer carrying means are relatively manually movable so that an alignment can be effected by viewing the elements to be aligned through a microscope. After the alignment is achieved the wafer is clamped between the chuck and the mask or glass photographic pattern by electromagnetic force. The parts are then held in aligned position without the aid of a vacuum which may then be released from the chuck and the operation to be performed may be expeditiously conducted.

When the electromagnet is deenergized, springs separate the mask or master pattern from the wafer so that the next operation can be conducted with a new mask or pattern without any danger of marring, abrading or damaging the wafer bearing antecedently formed subcircuit patterns of the integral circuit being formed.

In the accompanying drawings which form part of the instant specification and which are to be read in conjunction therewith and in which like reference numerals are used to indicate like parts inthe various views.

Figures 1, 4:
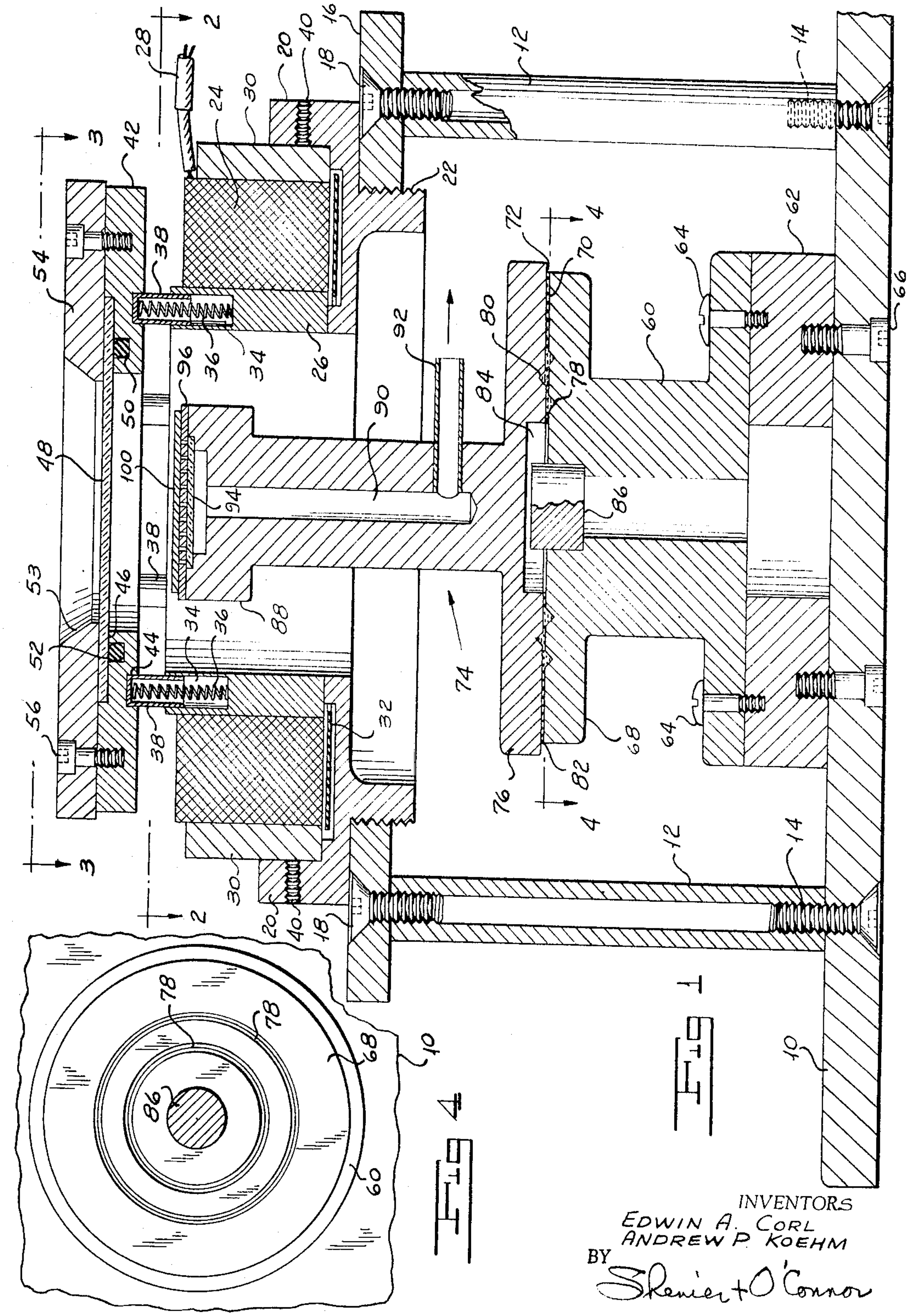
FIGURE 1 is a sectional view of a micropattern aligning device showing one embodiment of our invention.
FIGURE 4 is a fragmentary sectional view taken along the line 4—4 of FIGURE 1.
Figure 2:
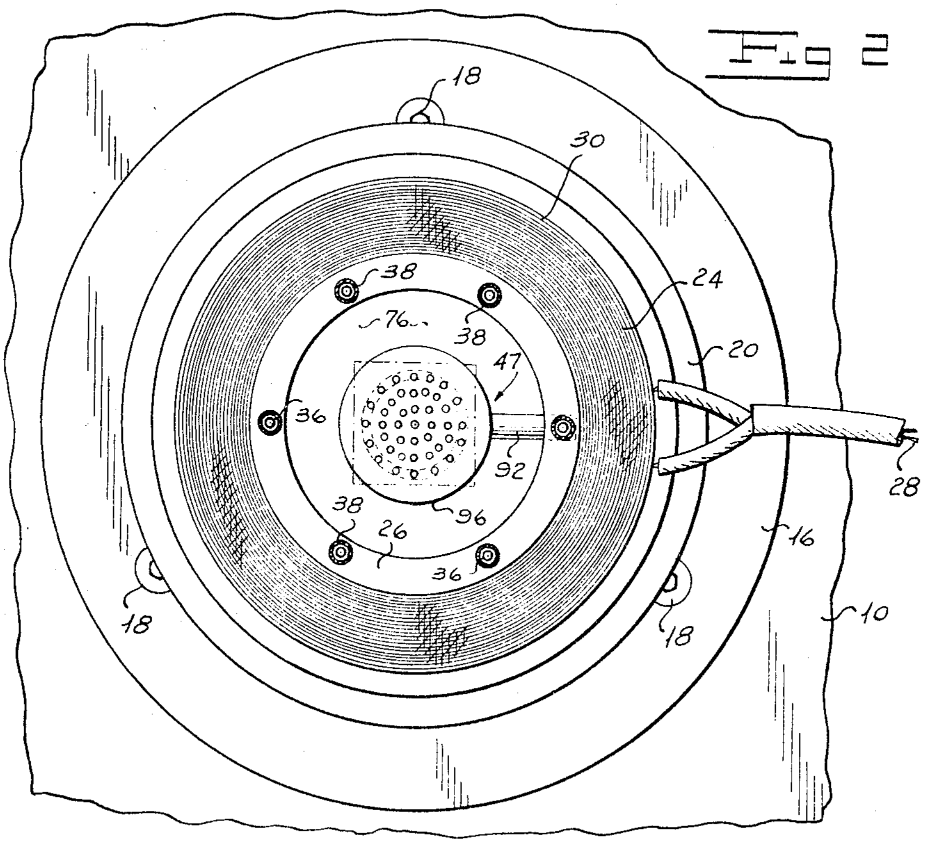
FIGURE 2 is a sectional view taken along the line 2—2 of FIGURE 1.
Figure 3:
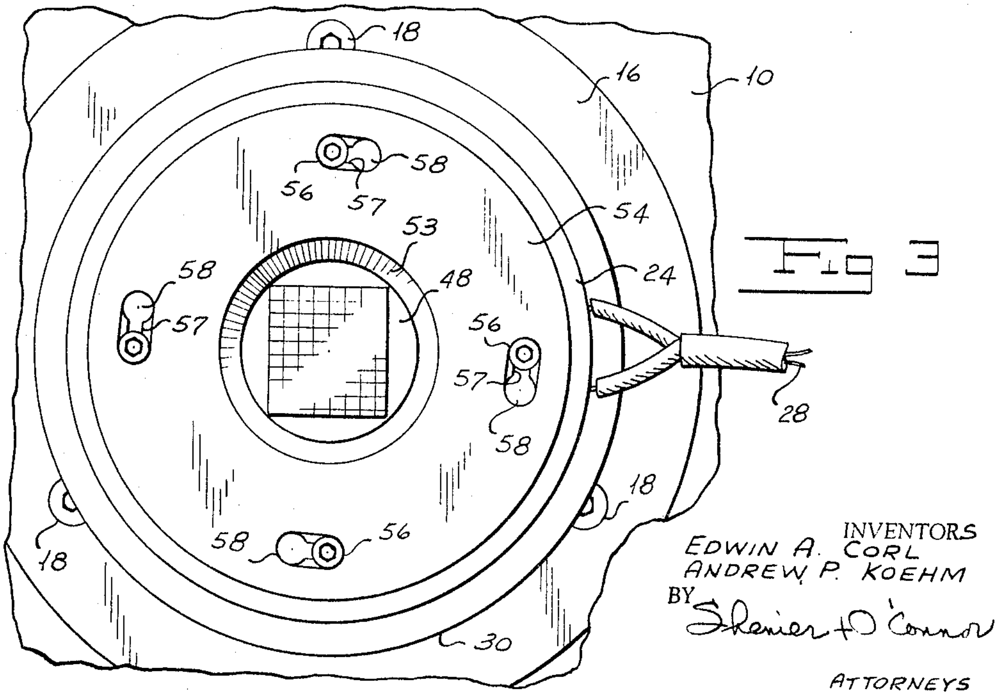
FIGURE 3 is a top plan view with parts broken away taken along the line 3—3 of FIGURE 1.

More particularly referring now to the drawings, a base 10 of any appropriate material such as metal carries a plurality of struts 12 secured thereto by any appropriate means such as machine screws 14. The struts carry a ring 16 which is secured thereto by any appropriate means such as machine screws 18. A carrier 20 is secured to the ring 16 by screw threads 22. Rotation of the carrier 20 will move the assembly upwardly and downwardly so that the distance between the mask 48 and the wafer to be treated can be readily adjusted, thus controlling the distance through which the armature 42 will have to move to bring about contact between the mask and the wafer when the winding 24 is energized. Winding 24 is wound about an annular core 26 made of ferromagnetic material such as soft iron or the like. The winding is adapted to be energized through conductors 28 from any appropriate source of direct current electric power. The winding is protected by an outer ring 30 of ferromagnetic material which furnishes the return path for the magnetic flux. A disc of insulating material 32 is positioned below the winding 24 upon the carrier 20. The annular core 26 is provided with a plurality of bores 34 which house springs 36. Plungers 38 are adapted to telescope into the bores 34 and are normally urged upwardly by the springs 36. The core ring 26, the winding 24 and the protective ring 30 are held in assembled relationship by a potting compound such as an epoxy resin. The winding assembly is secured to the carrier 20 by set screws 40. The plungers 38 are adapted to support an armature 42 made of ferromagnetic material and adapted to be pulled downwardly under the influence of the magnetic field erected by the winding 24 when it is energized. The plungers 38 seat in sockets 44 formed in the armature 42. The armature 42 is formed with an annular rabbet 46 in which the master pattern or mask 48 is adapted to be lodged. Armature 42 is formed with a groove 50 in which we position an O-ring 52 made of rubber or similar resilient material. The mask or photographic master 48 is held in position by a clamping ring 54 which is secured to the armature 42 by means of machine screws 56. The clamping ring 54 is provided with keyhole openings 58, as can be seen by reference to FIGURE 3. By partially loosening but not removing screws 56 the clamping ring can be rotated in a counterclockwise direction as viewed in FIGURE 3 to bring the heads of the machine screws 56 into the wide openings of the keyhole slots. The clamping ring 54 can then be readily lifted from the armature and the mask or photographic master 48 removed. The desired design on the mask or photographic master 48 is indicated diagrammatically by the area 47. When a new master is placed in the rabbet 46 the clamping ring 54 is repositioned and rotated in clockwise direction to bring the heads of the screws 56 over the shoulders 57 formed in the keyhole slots 58. The machine screws 56 are then tightened to clamp the photographic master or the mask between the clamping ring 54 and the armature 42.

A pedestal 60 is secured to a mounting ring 62 by machine screws 64. The mounting ring is in turn secured to the base 10 by machine screws 66. The pedestal 60 is formed with a flange 68 having a surface 70 adapted to mate with a surface 72 of a flange 76 formed on a manipulator indicated generally by the reference numeral 74. Polished surface 70 is formed with a plurality of circular grooves 78 and the polished surface 72 is formed with an annular groove 80. A high viscosity vacuum silicon grease 82 is spread between the mating flanges 76 and 68 and fills the reservoir formed by the grooves 80 and 78. This grease has a penetration (ASTM–D–217–52T) unworked at 77° C. from between 190 to 200 and worked at 77° C. of less than 310. The flange 76 is formed with a reentrant portion 84 into which there extends a stop plug 86 carried by the pedestal 60. The stop 86 limits the lateral motion of the manipulator 74. The arrangement is such that manual pressure on the manipulator will move the manipulator with respect to the pedestal at a slow but uniform rate without any overrun or hysteresis. The rate of movement is a function of the manual pressure exerted. By observing the top of the manipulator through a microscope very minute controlled movements can be accurately and easily made. Ordinarily a microscope having a magnification of 100 diameters may be advantageously employed. With proper optics we are able to adjust the manipulator with respect to the pedestal to within one micron. It is understood, of course, that for normal alignment in making integral microcircuitry embodying in situ formed transistors, diodes, and the like we need only adjust the alignment to within a tenth of a mil, namely 0.0001″. It will be observed that the diameter of the flange 76 is greater than the diameter of the flange 80 to facilitate manipulation of the manipulator 74 in respect of pedestal 60. The upper portion of the manipulator carries a chuck 88 positioned adjacent the top of the assembly just below the armature 42. The interior of the manipulator is formed with a bore 90 communicating with a brass pipe 92. The bore opens into the chuck the upper end of which is closed by a microporous metal disc 94 on which is seated a foraminous silicone rubber cushion 96. The wafer 100 to be treated is supported by the silicone rubber cushion. The distance between the wafer 100 and the mask 48 before the winding 24 is energized can be adjusted by screwing the carrier 20 upwardly or downwardly.

In the drawings for purposes of clarity the armature 42 is shown spaced from the ring core 26 a greater distance than it usually occupies. Normally the distance between the mask and the wafer is adjusted to between 1 and 1.5 mils. A hose (not shown) communicating with a source of reduced pressure (not shown) is adapted to be connected to the pipe 92 so that a reduced pressure can be applied to the interior of the bore 90 to hold the wafer 100 upon the chuck 88, which reduced pressure is controlled in accordance with means known to the art, such as a valve (not shown).

In use the wafer 100, which may be of any appropriate material as, for example, silicon bearing and epitaxial layer, is placed upon the chuck 88. The mask or photographic master has already been positioned upon the armature and clamped. The armature is then placed upon the plungers 38 and the spacing between the master 48 and the wafer 100 is adjusted about one mil by rotating the carrier 20 and permitting the adjustment to be made by its threaded engagement with the ring 16. The wafer is secured to the chuck with its flat portion toward the operator by applying a partial vacuum or reduced pressure through the pipe 92. This reduced pressure acts through the microporous metal disc 94 and the foraminous rubber cushion 96 to permit atmospheric pressure to hold the wafer on the chuck. The cushion allows for any irregularities on the rough side of the disc.

The partial vacuum is such that the wafer is held to the chuck with a pressure of about 15 to 26 inches of Hg.

The alignment is then viewed through a microscope (not shown) with a relatively large depth of view with the line of sight perpendicular to the mask 48. It will be observed that the clamping ring 54 is provided with a bevelled surface 53 so that the clamping ring will not interfere with the field of view. The manipulator 74 is then operated manually to bring the pattern into alignment. This can be done rapidly and expeditiously owing to the fact that the mating surfaces 70 and 72 between the manipulator and the pedestal flanges are highly polished and a high vacuum silicon grease enables this to be done without hysteresis or overrun. The grease retaining grooves 78 and 80 provide a reservoir for the grease and contribute to the free movement of the manipulator. Owing to the fact that there is no overrun or hysteresis even an unskilled operator has no difficulty in making the alignment. The manipulator permits not only lateral movement in any direction but also rotational movement.

After the alignment is completed direct current is applied through the conductors 28 to energize the winding 24. This will bring the mask into intimate contact with the wafer. This contact can be readily observed owing to the formation of Newton interference fringes which will be clearly visible when parallel and uniform contact is made.

A rheostat (not shown) controls the current density through the electromagnet winding 24 such that the pressure of the mask upon the wafer is between 15 and 20 inches of Hg. If the process is photographic, the surface of the silicon wafer will have been coated with photoresist compound. Any photoresist known to the art may be employed; that is, a material which will harden upon exposure to light and protect the silicon wafer. The pattern is developed by removing the unexposed photoresist which remains readily removable. When the alignment is completed the photoresist is exposed to ultraviolet light for a prescribed period depending upon the photoresist being used. After exposure the current energizing the winding 24 is interrupted and the mask removed. The vacuum is then released from the wafer, it is removed and the pattern developed. After the pattern is developed the wafer is etched to remove the silicon oxides. Any appropriate etching material such as buffered hydrofluoric acid may be employed. The pattern is then doped by either an acceptor impurity or a donor impurity depending upon whether it is desired to produce p or n areas. After doping the wafer is reoxidized by oxygen or humidified air or steam. The wafer is then repositioned, a new pattern for developing a new segment or subassembly of the integrated circuit is then secured in the armature and the process repeated.

If the vacuum deposition of metal is to be practiced after the wafer and the mask are clamped between the armature and the chunk by the energization of the winding 24 the vacuum to the wafer is released and the parts will be held in position owing to the electromagnetic clamping. The device with the current flowing through the winding or electromagnet is then placed in a vacuum chamber and the appropriate metal may be evaporated for deposition on to the wafer through the mask to form the the desired circuit components. For example, if a register is to be formed between two predetermined points, Nikrome (a nickel-chromium steel), tantalum or the like may be evaporated. If conductors are to be placed between two desired points, gold, silver, aluminum or copper may be evaporated through the mask. It will be understood that any appropriate metal may be deposited through the mask by evaporation of the metal in a vacuum.

After the deposition is competed the winding 24 is deenergized and the parts can be removed and the process repeated with a new mask, or other and further steps in the formation of the desired integral circuit can be conducted as will be understood by those skilled in the art.

It will be seen that we have accomplished the objects of our invention. We have provided a micropattern aligning device in which the mask and the surface of the wafer to be treated are always parallel irrespective of the variations in thickness of the substrates or wafers. Each successive substrate is aligned in the same manner so that all substrates remain parallel. We have provided a micropattern aligning assembly which is simple and convenient to use and which avoids the employment of a gimbal, mechanical stop and rocking wafer base constructions such as are employed by aligning devices of the prior art.

Our micropattern aligning assembly is such that the mask is held against the substrate independent of vacuum or reduced pressure once the parts are aligned and clamped, thus enabling our device to function without relying upon seals and lapped seats as is the case in devices of the prior art. Owing to the fact that no vacuum need be employed once the parts are clamped, our micropattern aligning device may be used in small vacuum chambers for vacuum evaporation of metals and deposition through a mask. No mechanical linkages are required to effect the alignment and our arrangement is such that alignment may be achieved by simple manual manipulation in an accurate, simple, convenient and expeditious manner.

It will be understood that certain features and subcombinations are of utility and may be employed without reference to other features and subcombinations. This is contemplated by and is within the scope of our claims. It is further obvious that various changes may be made in details with in the scope of our claims without departing from the spirit of our invention. It is, therefore, to be understood that our invention is not to be limited to the specific details shown and described.

Having thus described our invention, what we claim is:

1. A micropattern aligning device including in combination a base, a pedestal formed with a flange, means mounting said pedestal on said base, said flange having a polished surface, said surface being formed with an annular groove, a chuck formed with a flange, said flange having a polished surface, said surface being formed with a groove, the polished surface of said flange and the polished surface of said pedestal being adapted to mate, a viscous fluid positioned between said mating surfaces, said grooves being adapted to form a reservoir for said viscous fluid, said chuck being formed with a bore and provided with an opening communicating with the atmosphere through which reduced pressure is adapted to be applied to the interior of said chuck, a rigid microporous disc carried by the upper portion of said chuck and communicating with said bore, a resilient foraminous disc carried by said rigid microporous disc, a carrier, means for supporting said carrier on said base around said chuck, an annular electromagnet carried by said carrier, means for moving said carrier away from and toward said base, a plurality of springs carried by said carrier, an armature supported by said springs in a position above said chuck and in the field of said electromagnet when energized, means carried by said armature for clamping in a desired pattern to said armature, the construction being such that a material to be treated is clamped to the chuck by means of said pattern when said electromagnet is energized to attract said armature.

2. A micropattern aligning device including in combination a base, a pedestal formed with a flange, means mounting said pedestal on said base, said flange having a polished surface, a chuck formed with a flange, said flange having a polished surface, the polished surfaces of said flange and said pedestal being adapted to mate, a viscous fluid positioned between said mating surfaces, said chuck being formed with a bore and provided with an opening communicating with the atmosphere through which reduced pressure is adapted to be applied to the interior of the chuck, foraminous mounting means carried by said chuck, a carrier, means for supporting said carrier on said base, an electromagnet carried by said carrier, means for adjusting said carrier with respect to said base, a plurality of yieldable means carried by said carrier, an armature supported by said yieldable means in a position above said chuck and in the field of said electromagnet when energized, means carried by said armature for clamping a desired pattern thereto, the construction being such that a material to be treated is clamped to the chuck by means of said pattern upon the energization of said electromagnet.

3. A micropattern aligning device including in combination a chuck adapted to carry material to be treated, an electromagnet positioned around said chuck, an armature adapted to be attracted by said electromagnet when energized, means upon said armature for carrying a pattern to be reproduced, a seat on said chuck for supporting material to be treated, means for moving said chuck relative to said armature in one plane, means mounting said armature for movement at right angles to said plane and means for energizing said electromagnet to attract said armature to clamp the material carried by the chuck between the chuck seat and the pattern.

4. A micropattern aligning device including in combination a chuck, a seat carried by said chuck for material to be treated, partial vacuum means for holding the material to be treated upon said chuck seat, a carrier, an electromagnet supported by said carrier, yieldable supporting means carried by said carrier, an armature borne by said yieldable supporting means, means for securing a pattern to be reproduced to said armature, means for adjusting said chuck in a plane substantially parallel to said pattern, means for adjusting said carrier in a direction to and from said plane, the construction being such that upon energization of the electromagnet the material to be treated is clamped between said chuck and said pattern whereby said partial vacuum theretofore holding said material upon said chuck may be released.

5. A micropattern aligning device including in combination a base, a vacuum chuck carried by said base, viscous fluid between said chuck and said base whereby to enable said chuck to be moved relative to said base parallel to the plane of said base, a porous seat carried by said chuck adapted to support a wafer to be treated and to be held upon said chuck by a partial vaccum, a carrier, means for supporting said carrier on said base around said chuck, electromagnetic means carried by said carrier, means for moving said carrier away from and toward said base, a plurality of resilient means carried by said carrier, an armature being supported by said resilient means above said chuck and in the field of said electromagnet when it is energized, means carried by the armature for securing a desired pattern thereto, the construction being such that the wafer upon said chuck is clamped thereto by means of said pattern when the electromagnet is energized to attract said armature whereby said vacuum may be released and maintain the pattern in adjusted position with respect to the wafer.

6. A micropattern aligning device including in combination a base, a polished surface on said base, a chuck adapted to support a wafer to be treated, said chuck having a polished surface to match the polished surface on said base, said chuck surface freely resting on said base surface with a viscous fluid between them, a carrier, means for supporting said carrier on said base around said chuck, electromagnetic means carried by said carrier, a plurality of resilient means carried by said carrier, an armature being supported by said resilient means above said chuck and in the field of said electromagnet when it is energized, means carried by said armature for securing a desired pattern thereto, the construction being such that the wafer upon said chuck is clamped thereto by means of said pattern when the electromagnet is energized to attract said armature whereby said vacuum may be released and maintain the pattern in adjusted position with respect to the wafer.

References Cited by the Examiner

UNITED STATES PATENTS 2,437,229 3/1948 Mears ---------------- 95—76
3,192,844 7/1965 Szasz et al. ----------- 95—73

JULIA E. COINER, *Primary Examiner.*